United States Patent [19]
Domenichini et al.

[11] Patent Number: 5,550,477
[45] Date of Patent: Aug. 27, 1996

[54] METHODS AND APPARATUS FOR TESTING ARMATURE COILS AND COIL LEAD CONNECTIONS USING RESISTANCE MEASUREMENTS

[75] Inventors: Carlo Domenichini, Siena; Mauro Tarchi, Florence, both of Italy

[73] Assignee: Axis USA, Inc., Tampa, Fla.

[21] Appl. No.: 285,057

[22] Filed: Aug. 1, 1994

[51] Int. Cl.⁶ .......................... G01R 27/14; G01R 27/02
[52] U.S. Cl. .......................... 324/545; 324/713; 324/772
[58] Field of Search .................................. 324/510, 545, 324/546, 713, 715, 772, 134; 318/490; 322/99; 340/648

[56] References Cited

U.S. PATENT DOCUMENTS

| | | | |
|---|---|---|---|
| 2,890,407 | 6/1959 | Huehn et al. | 324/545 |
| 3,270,277 | 8/1966 | Ward | 324/545 |
| 3,590,373 | 6/1971 | Lake | 324/691 |
| 3,746,979 | 7/1973 | Kildishev | 324/545 |
| 3,896,376 | 7/1975 | Sinniger | 324/772 |
| 4,053,830 | 10/1977 | Porter | 324/545 |
| 4,651,086 | 3/1987 | Domenichini | 324/772 X |
| 4,766,387 | 8/1988 | Browne et al. | 324/545 |
| 4,864,242 | 9/1989 | Hurley | 324/510 |
| 5,140,276 | 8/1992 | Fisher | 324/713 |
| 5,256,977 | 10/1993 | Domenichini | 324/546 |
| 5,307,019 | 4/1994 | Robey et al. | 324/713 |

OTHER PUBLICATIONS

"Armature Test System," Product Brochure of the ATS–700 Series Automatic Test System, Automation Technology, Dayton, Ohio (undated).

"Armature Test Information," Data Sheet of Automation Technology, Dayton, Ohio (undated).

*Primary Examiner*—Kenneth A. Wieder
*Assistant Examiner*—Diep Do
*Attorney, Agent, or Firm*—Fish & Neave; Robert R. Jackson; G. Victor Treyz

[57] ABSTRACT

An improved armature testing apparatus and method are provided. The individual resistances of two commutator bar lead connections can be simultaneously measured in a single measurement step. Further, the resistances of two armature coil can be determined in the same step. The present invention makes it possible to measure individual commutator coil lead connections more quickly than was previously possible.

49 Claims, 8 Drawing Sheets

| | | | | |
|---|---|---|---|---|
| STEP 1: | $R_{S1}$ | $R_{B1}$ | $R_{S7}$ | $R_{B8}$ |
| STEP 2: | $R_{S2}$ | $R_{B2}$ | $R_{S8}$ | $R_{B9}$ |
| STEP 3: | $R_{S3}$ | $R_{B3}$ | $R_{S9}$ | $R_{B10}$ |
| STEP 4: | $R_{S4}$ | $R_{B4}$ | $R_{S10}$ | $R_{B11}$ |
| STEP 5: | $R_{S5}$ | $R_{B5}$ | $R_{S11}$ | $R_{B12}$ |
| STEP 6: | $R_{S6}$ | $R_{B6}$ | $R_{S12}$ | $R_{B1}$ |
| STEP 7: | $R_{S7}$ | $R_{B7}$ | $R_{S1}$ | $R_{B2}$ |

*FIG. 4*

STEP1: $R_{S1}$ $R_{B1}$ $R_{S6}$ $R_{B7}$

STEP2: $R_{S2}$ $R_{B2}$ $R_{S7}$ $R_{B8}$

STEP3: $R_{S3}$ $R_{B3}$ $R_{S8}$ $R_{B9}$

STEP4: $R_{S4}$ $R_{B4}$ $R_{S9}$ $R_{B10}$

STEP5: $R_{S5}$ $R_{B5}$ $R_{S10}$ $R_{B11}$

STEP6: $R_{S6}$ $R_{B6}$ $R_{S11}$ $R_{B12}$

STEP7: $R_{S7}$ $R_{B7}$ $R_{S12}$ $R_{B1}$

METHODS AND APPARATUS FOR TESTING ARMATURE COILS AND COIL LEAD CONNECTIONS USING RESISTANCE MEASUREMENTS

BACKGROUND OF THE INVENTION

This invention relates to methods and apparatus for testing armatures. More particularly, the invention relates to methods and apparatus for ensuring that armature coils and coil lead connections to armature commutators are formed properly.

It is known to test the coils and coil lead connections of armatures by measuring the resistance of the armature coils and coil leads. If the resistance of a coil or coil lead is determined to be too high, the armature can be rejected. One such apparatus for testing armatures is shown in U.S. Pat. No. 4,651,086, which describes a machine that measures the resistance of coils and coil lead connections using an arrangement in which the voltage at two separate leads is equalized using a feedback circuit. Because the voltage at these two leads is the same, current is prevented from flowing through a number of the coils, which allows the resistance of an individual coil lead connection to be measured. However, it is not possible with the arrangement described in the aforementioned U.S. Pat. No. 4,651,086, to measure more than one coil lead connection resistance and one coil resistance measurement to be made at a time. To measure N coil lead connection resistances and N coil resistances requires N measurement steps. Because each step of measuring a set of resistances (i.e., a coil lead connection resistance and a coil resistance) requires a finite minimum amount of time, it would be desirable to increase the throughput of such armature testers by reducing the number of measurement steps that must be performed without significantly increasing the time required for each measurement step.

An apparatus for testing an armature with fewer measurement steps is shown in U.S. Pat. No. 5,140,276. However, the apparatus described in U.S. Pat. No. 5,140,276 does not equalize the voltage at a pair of lead connections as is done with the arrangement described in the aforementioned U.S. Pat. No. 4,651,086. As a result, there is an undesirable current flow through some of the coils, which reduces the accuracy of the resistance measurements. A further disadvantage of the testing apparatus described in U.S. Pat. No. 5,140,276 is that it does not allow the individual measurement of coil lead connection resistances. Rather, pairs of diametrically opposed lead connection resistances must be measured together. Because of this limitation, the testing apparatus of U.S. Pat. No. 5,140,276 does not determine the status of each individual coil lead connection, which can lead to inaccuracies. For example, because only the average resistance of two lead connections is known, occasionally, one of the two resistances will be unusually low and will inadvertently compensate for the abnormally high resistance of the other lead connection in the pair. As a result, the testing apparatus of U.S. Pat. No. 5,140,276 may fail to detect certain defective lead connections that would have been detected if the lead connection resistances were measured individually.

It would therefore be desirable to provide an improved method and apparatus for armature testing that allows individual coil lead connection resistances to be measured and that allows the coil lead connection resistances and coil resistances of an armature to be measured in fewer steps than has previously been possible.

It is thus an object of the present invention to provide a method and apparatus for testing armatures, whereby individual armature coil lead connection resistances and armature coil resistances are measured in approximately half the number of steps that have previously been required.

SUMMARY OF THE INVENTION

This and other objects of the invention are accomplished in accordance with the principles of the invention by providing an improved armature testing machine and method of operation. The apparatus uses a control circuit to balance the voltage at two distinct coil lead connections so that no current flows between those connection or across any intervening coils. Two separate circuits are used to induce current in at least two of the coil lead connections and in two of the coils. The first circuit induces a fixed current. The second is a variable circuit that can be controlled to induce a current that is sufficient to balance the voltage at the two distinct coil lead connection points. The first and second circuits may be current sources or voltage generators serially coupled with respective ammeters. In either case, the value of the induced current in each coil lead connection and coil is known.

Four voltmeters are used to measure two separate coil lead connection voltages and two coil voltages during each measurement step. In combination with the known currents flowing through the coil lead connections and coils, these voltages are used to determine the individual resistances of two coil lead connections and two individual coils in a single measurement step. Typically, for an armature with N coils, N/2+1 measurement steps are required to measure all of the desired coil resistances and coil lead connection resistances.

Further features of the invention, its nature and various advantages will be more apparent from the accompanying drawings and the following detailed description of the preferred embodiments.

BRIEF DESCRIPTION OF THE DRAWINGS

FIG. 4 is a table showing the coil lead connection resistances and coil resistances that are measured for each step for a 12 coil armature when the testing apparatus is arranged to measure coil lead connection resistances that are diametrically opposed.

FIG. 5 is a table showing the coil lead connection resistances and coil resistances that are measured for each step for a 1 coil armature when the testing apparatus is arranged to measure coil lead connection resistances that are offset by −1 index value from the diametrically opposed arrangement that results in the measurements of FIG. 4.

DETAILED DESCRIPTION OF THE PREFERRED EMBODIMENTS

Figure 1:
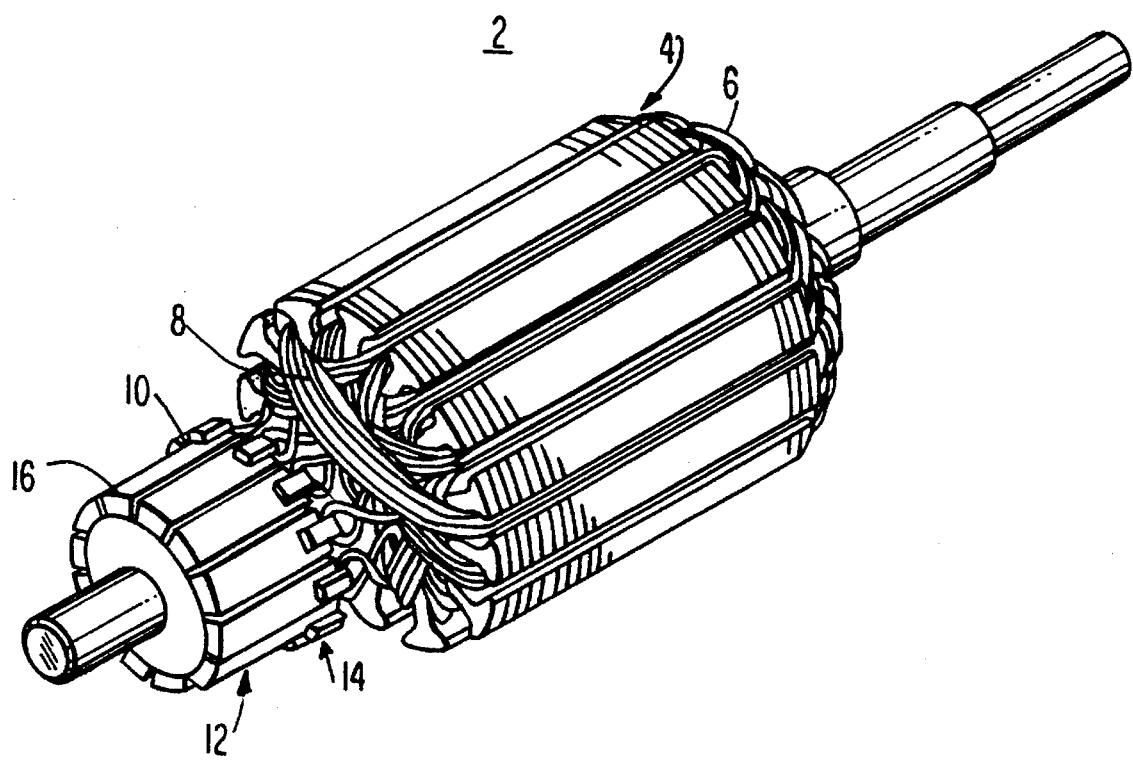
FIG. 1 is a perspective view of an electric motor armature showing the armature coils, which have been wound into the armature slots, and showing the location of the coil lead connections.

An electric motor armature 2 is shown in FIG. 1. Armature 2 has a number of armature slots 4, into which wire 6 is wound to form coils 8. At appropriate stages during the winding process, wire 6 is typically wound around tangs 10 of commutator 12 to form coil lead connections 14. Coil lead connections 14 can also be formed without using tangs 10 by using an alternative technique in which wire 6 is wound into various commutator slots. Regardless of which technique is used to form the coil lead connections 14, the connections electrically connect the coils 8 to commutator bars 16. In completed electric motors, brushes contact bars 16 to supply current to the coils 8.

During the process of manufacturing armatures, stable electrical and mechanical coil lead connections must be formed between the wires 6 of each coil 8 and bars 16. In order to create a durable connection between wire 6 and bars 16 with tangs 10, a fusing machine is used to heat the tangs 10 and to compress them on top of the wire 6. Although the machines that are used to form the wire lead connections 14 are typically quite reliable, in order to obtain the best possible results, it is desirable to test some, if not all, armatures 2 to ensure that the coil lead connections 14 are being formed properly. If some of the coil lead connections 14 are being formed with, for example, insufficient heat and pressure during fusing, those connections might not be as reliable as they should be. Because such defective connections are characterized by higher than normal resistances, it is possible to test coil lead connections 14 by measuring the resistance of each individual connection. If a coil lead connection 14 on an armature 2 is determined to have an abnormally high resistance, that armature can be rejected.

If many of the coil lead connections are found to have resistances that are higher than normal, it is possible that the machine that is used to form the coil lead connections is not properly adjusted or needs to be serviced. Routine testing of armatures can therefore be used to ensure the reliable formation of coil lead connections 14.

In addition to monitoring the condition of the coil lead connections 14, it is desirable to be able to measure the resistances of the coils 8, because in this way the continuity of the wire 6 in each of coils 8 can be tested. If the measured resistance of a coil 8 is not within normal tolerances, the armature may be rejected.

Figure 2:
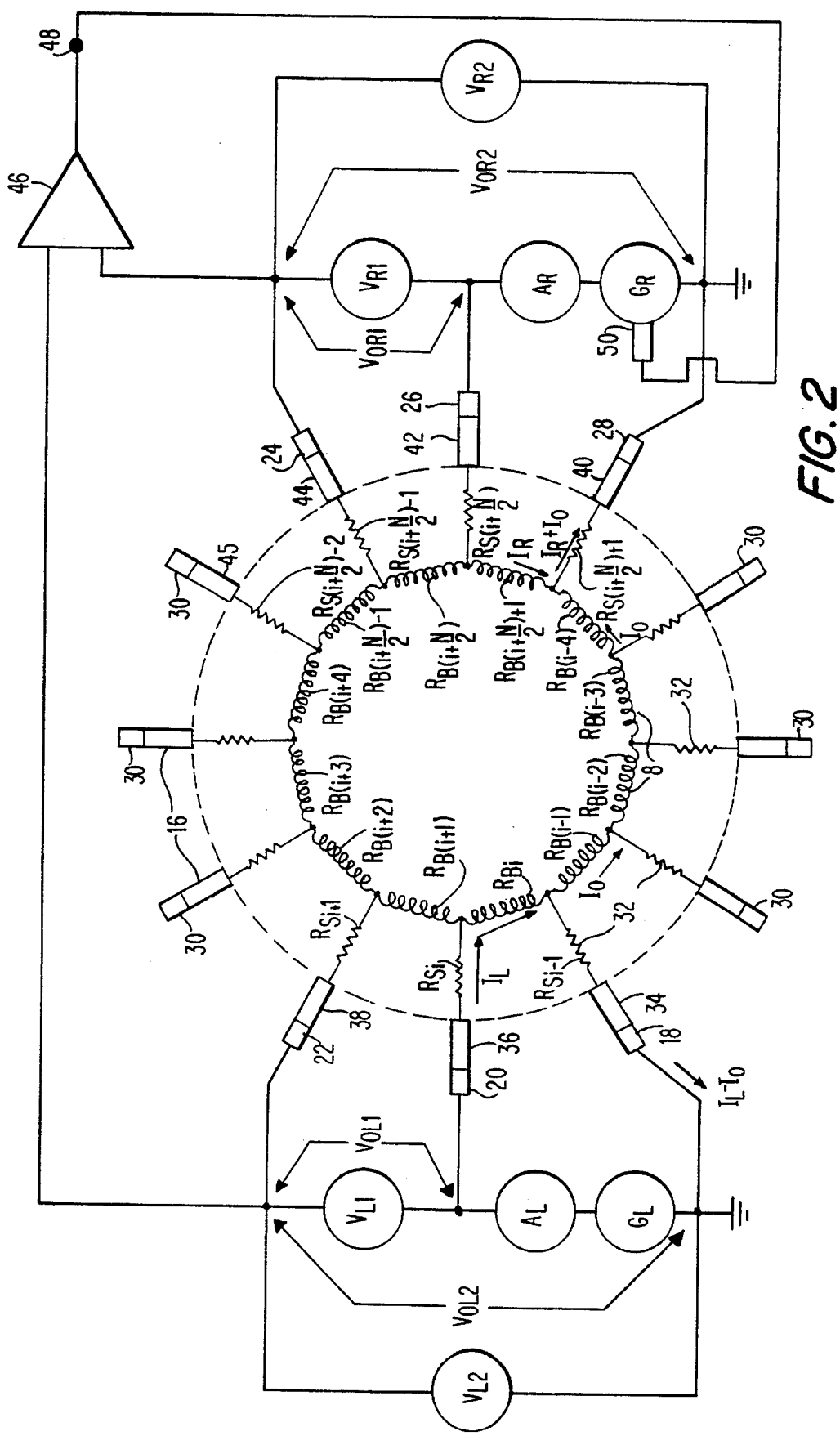
FIG. 2 is a circuit diagram showing the measurement of various coil lead connection resistances and coil resistances in accordance with the present invention.

A portion of a testing apparatus constructed in accordance with the present invention is shown in FIG. 2. The testing apparatus has contact members 18, 20, 22, 24, 26, 28, and 30, which make intimate electrical contact with commutator bars 16. The contact resistance between the contact members and commutator bars 16 is negligible, and is therefore not shown in the circuit diagram of FIG. 2. The resistances of the various coil lead connections are represented by resistors 32, which are labeled $R_{si}$, $R_{si+1}$, etc. The armature 2 shown in FIG. 2 has 12 coils 8 and 12 corresponding bars 16, but armatures with any number of coils 8 greater than six can be tested using the arrangement of the present invention. In general, an armature will have N coils 8 and N corresponding bars 16 connected to the coils at N coil lead connections 14. In accordance with the present invention, the individual resistances of each of the N coils 8 and the N coil lead connections 14 can be obtained in N/2+1 measurements steps as opposed to the N measurement steps that were previously required During a measurement step, a current is induced in coil $R_{Bi}$ by fixed current inducing circuitry. For example, a voltage generator $G_L$ can be used to apply a voltage across commutator bars 34 and 36. Ammeter $A_L$ can then measure the current that flows through lead connection resistance $R_{si}$, coil resistance $R_{Bi}$, and lead connection resistance $R_{s(i-1)}$. Alternatively, a fixed current source connected between bars 34 and 36 can be used to supply a known current to lead connection resistance $R_{si}$, coil resistance $R_{Bi}$, and lead connection resistance $R_{s(i-1)}$. Regardless of whether a serially connected fixed voltage generator and ammeter or a fixed current source is used, voltmeter $V_{L1}$ preferably measures the voltage across commutator bars 36 and 38. Voltmeter $V_{L2}$ preferably measures the voltage across bars 34 and 38.

Variable current inducing circuitry is also used to induce a variable current in lead connection resistance $R_{s(i+N/2)}$, coil resistance $R_{B(i+N/2)+1}$, and lead connection resistance $R_{s(i+N/2)+1}$. For example, a voltage can be applied across commutator bars 40 and 42 by voltage generator $G_R$. The current that flows through lead connection resistance $R_{s(i+N/2)}$ and coil resistance $R_{B(i+N/2)+1}$, and $R_{s(i+N/2)+1}$ as a result, can then be measured by ammeter $A_R$. Alternatively, a variable current source connected between bars 40 and 42 can be used to induce a known current.

Regardless of whether the variable current inducing circuitry is a serially connected voltage generator and ammeter or is a current source, voltmeter $V_{R1}$ preferably measures the voltage across commutator bars 42 and 44. Voltmeter $V_{R2}$ preferably measures the voltage across bars 40 and 44.

The voltage levels at commutator bar 38 and commutator bar 44 are monitored and the voltage generator $G_R$ or variable current source is controlled accordingly, to ensure that the voltage between commutator bar 38 and commutator bar 44 is negligible. The implementation of this type of feedback loop is represented schematically by the control circuit 46, which generates a control signal at output terminal 48 that is used to control generator $G_R$ or the variable current source via regulator circuit 50, which may be separate circuitry or which may be circuitry contained within generator $G_R$ and ammeter $A_R$ or within the variable current source.

Because the voltage is precisely the same at commutator bars 38 and 44, no current flows between these two points. As a result, no current flows in lead connection resistance $R_{s(i+1)}$, coils $R_{B(i+3)}$, $R_{B(i+4)}$, and $R_{B(i+N/2)-1}$, and lead connection resistance $R_{s(i+N/2)-1}$. It therefore follows that no current flows in the immediately adjoining coils $R_{B(i+1)}$ and $R_{B(i+N/2)}$. Because no current flows in lead connection resistances $R_{s(i+1)}$ and $R_{s(i+N/2)-1}$ and coils $R_{B(i+1)}$ and $R_{B(i+N/2)}$, the voltages $V_{OL1}$ and $V_{OR1}$ that are measured by voltmeters $V_{L1}$ and $V_{R1}$ represent the voltage drops across lead connection resistances $R_{si}$ and $R_{s(i+N/2)}$. The currents $I_L$ and $I_R$, which flow through these respective resistances, are either measured by ammeters $A_L$ and $A_R$ or are the known outputs of the fixed and variable current sources. The lead connection resistances can therefore be calculated as follows: $R_{Si} = V_{0L1}/I_L$ and $R_{S(i+N/2)} = V_{0R1}/I_R$.

It is not necessary to connect the input terminals of control circuit 46 to commutator bars 38 and 44 in order to prevent current from flowing through coils $R_{B(i+1)}$ and $R_{B(i+N/2)}$, although that arrangement is generally preferred. If the voltages at the endpoints of any one or more of the coils that join coils $R_{B(i+1)}$ and $R_{B(i+N/2)}$ are equalized, no current will flow through coils $R_{B(i-1)}$ and $R_{B(i+N/2)}$.

In addition to obtaining the two independent lead connection resistances $R_{Si}$ and $R_{S(i+N/2)}$, the arrangement in FIG. 2 is used to obtain the two coil resistances $R_{Bi}$ and $R_{B(i+N/2)+1}$. Voltmeter $V_{L2}$ is preferably used to measure the voltage $V_{0L2}$ across commutator bars 38 and 34. Similarly, voltmeter $V_{R2}$ is preferably used to measure the voltage $V_{0R2}$ across commutator bars 44 and 40. The voltage at commutator bar 34 will generally differ slightly from the voltage at commutator bar 40. As a result, a small current $I_0$ will flow through coil lead connection $R_{S(i-1)}$, coils $R_{B(i-1)}$, $R_{B(i-2)}$, $R_{B(i-3)}$, $R_{B(i-4)}$, and coil lead connection $R_{S(i+N/2)+1}$. The coil resistances $R_{Bi}$ and $R_{B(i+N/2)+1}$ can therefore be described by Equations 1 and 2.

$$R_{Bi} = V_{0L2}/I_L - ((I_L - I_0) * R_{S(i-1)})/I_L \quad (1)$$

$$R_{B(i+N/2)+1} = V_{0R2}/I_R - ((I_R + I_0) * R_{S(i+N/2)+1})/I_R \quad (2)$$

It can be shown that the magnitude of $I_0$ is a fraction of the difference between $I_R$ and $I_L$. Because the magnitudes of $I_R$ and $I_L$ are typically within at most a few per cent of each other, $I_0$ will be no greater than at most a few percent of $I_R$ and $I_L$. Further, in practice, the measured values of coil lead connection resistances are typically on the order of microohms, whereas the values of typically measured coil resistances are on the order of milliohms. Thus, Equations 1 and 2 can be very accurately approximated by Equations 3 and 4.

$$R_{Bi} = V_{0L2}/I_L \quad (3)$$

$$R_{B(i+N/2)+1} = V_{0R2}/I_R \quad (4)$$

It is therefore possible to make four voltage and two current measurements within a single measurement step. These measurements allow two coil lead connection resistances and two coil resistances to be determined.

Although the voltage $V_{0L1}$ is preferably measured using a voltmeter connected between commutator bar 36 and commutator bar 38, voltmeter $V_{L1}$ can be satisfactorily connected between commutator bar 36 and any of the commutator bars connected to the coils that join coils $R_{B(i+1)}$ and $R_{B(i+N/2)}$, such as coils $R_{B(i+2)}$, $R_{B(i+3)}$, etc. For example, if voltmeter $V_{L1}$ is connected between bar 36 and bar 44, the measured voltage will be the same as that measured when voltage $V_{L1}$ is connected between bars 36 and 38. Similarly, voltmeter $V_{R1}$ is preferably connected between commutator bars 42 and 44, but may, if desired, be connected instead between commutator bar 42 and any of the commutator bars connected to the coils that join coils $R_{B(i+1)}$ and $R_{B(i+N/2)}$, such as between bars 42 and 38, or between bars 42 and 45. Regardless of which of these connections is made, the measured voltage $V_{0R1}$ will be the same.

Voltmeters $V_{L2}$ and $V_{R2}$ may also be connected to the commutator bars in other satisfactory patterns. Voltmeter $V_{L2}$ can be connected between commutator bar 34 and any of the commutator bars connected to the coils that join coils $R_{B(i+1)}$ and $R_{B(i+N/2)}$. Another possible, although less desirable arrangement would be to connect voltmeter $V_{L2}$ between bar 34 and bar 36. Voltmeter $V_{R2}$ can be connected between commutator bar 40 and any of the commutator bars connected to the coils that join coils $R_{B(i+1)}$ and $R_{B(i+N/2)}$. Voltmeter $V_{R2}$ could also be connected between commutator bars 40 and 42. Other connections are possible if the measurement circuitry on the right and left hand sides of FIG. 2 is shifted to higher or lower index values, for example, if the circuitry on the right hand side of FIG. 2 were connected to commutator bars 42, 44, and 45, the various allowed voltmeter connections would be reduced.

Figure 3:
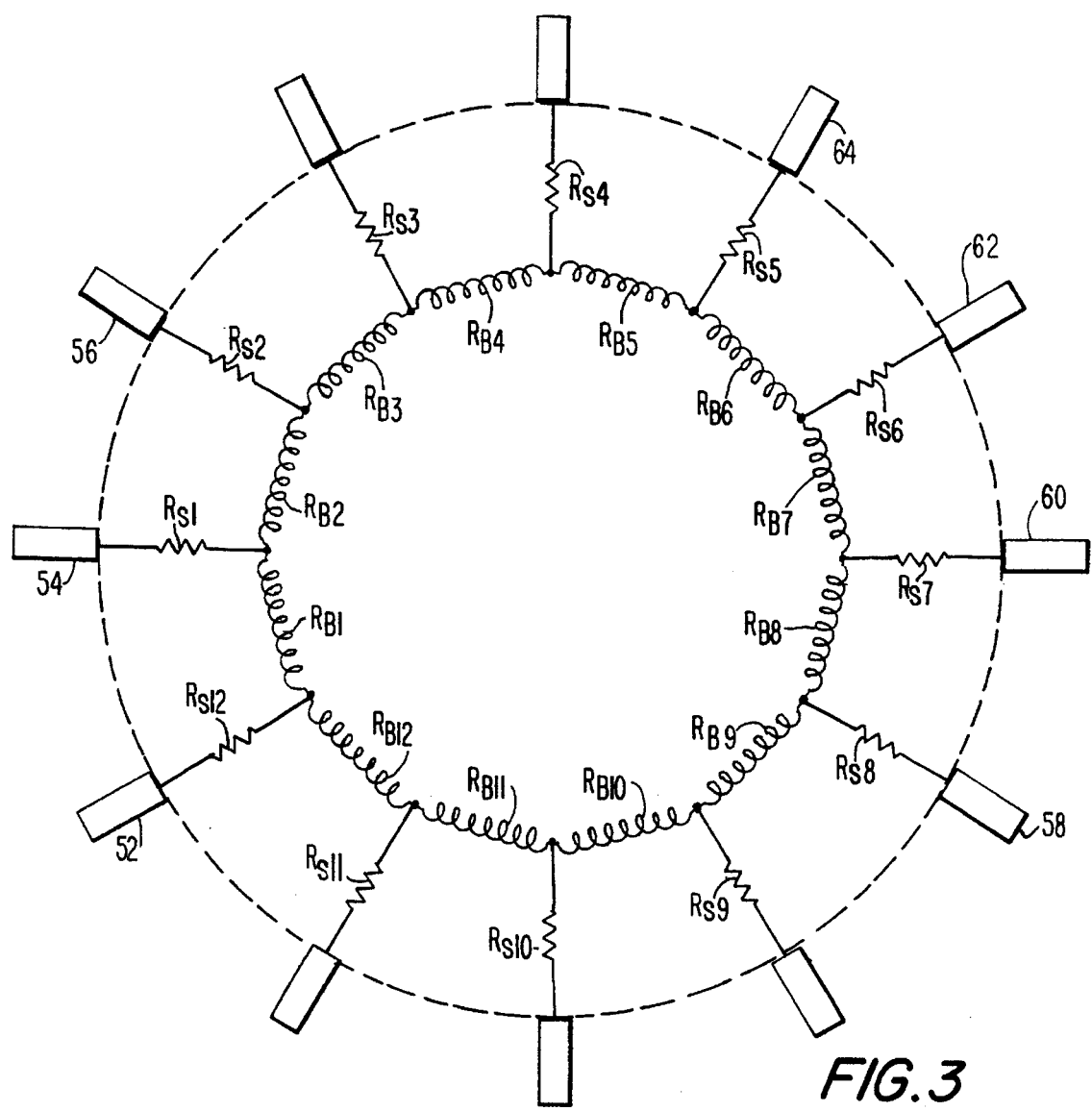
FIG. 3 is a circuit diagram showing the notation used to label the coil lead connections and coils for an armature having 12 coils.

As a general proposition, N/2+1 measurement steps will be required to measure each of the resistances of the coil lead connections 14 and coils 8 of an armature having N lead connections and N coils. This requirement is illustrated in FIGS. 3, 4, and 5 for a 12 coil armature. As shown in FIG. 3, the coil lead connection resistances have been labeled $R_{S1}$–$R_{S12}$. The coil resistances have been labeled $R_{B1}$–$R_{B12}$. Using the type of setup described above, voltmeters are preferably connected on the left hand side of FIG. 3 between commutator bars 52 and 54 and between bars 52 and 56, and on the right hand side of FIG. 3, between bars 58 and 60 and between bars 58 and 62. A serially connected ammeter and fixed voltage generator or a fixed current supply is connected between bars 52 and 54. Similarly, variable current inducing circuitry such as an ammeter and variable voltage generator or a variable current supply is serially connected between bars 58 and 60. A feedback loop is set up to feed back a control signal to the variable current inducing circuitry in order to maintain the voltage difference between bars 56 and 62 at a negligible value, as described in connection with FIG. 2.

As shown in FIG. 4, during the first measurement step, the values of $R_{S1}$, $R_{B1}$, $R_{S7}$, and $R_{B8}$ are obtained. Seven measurement steps are needed to completely test the armature, because it is not until the seventh step that the value of $R_{B7}$ can be obtained. It is also possible to measure the resistances of the coil lead connections 14 and the coils 8 using the setup of FIGS. 2 and 3, but with the connections to the commutator bars 16 shown on the right hand side of FIGS. 2 and 3 each shifted to the next lowest index value (e.g. i+N/2 becomes i+N/2−1, etc.) In FIG. 2, voltmeters $V_{L1}$ and $V_{L2}$, ammeter $A_L$ and generator $G_L$ (or the fixed current source) would be connected as previously described. The voltmeter $V_{R1}$ would be connected between bars 45 and 44, and the voltmeter would be connected between bars 45 and 42. The serially connected generator $G_R$ and ammeter $A_R$ (or the variable current source) would be connected between bars 42 and 44. In this case, the resistances $R_{Si}$, $R_{Bi}$, $R_{S(i+N/2)-1}$ and $R_{B(i+N/2)}$ are obtained in the first measurement step. Similarly, with the arrangement shown in FIG. 3, the previously described connections would be made by the components shown on the left hand side of FIG. 3, whereas the voltmeters shown on the right hand side of FIG. 3 would be connected between bars 60 and 64 and between 62 and 64. With the first measurement step, the values of $R_{S1}$, $R_{B1}$, $R_{S6}$, and $R_{B7}$ would be obtained, as shown in FIG. 5.

Although the resistances can be measured in a different order when the measurement circuitry is shifted with respect to the arrangement used to measure diametrically opposed coil lead resistances, the same number of steps are required to obtain all 24 of the desired resistances. If the resistance measurement circuitry shown on the right hand side of FIG. 2 is shifted further than the positions in which contact member 26 contacts $R_{S(i+N/2)-1}$ (or, in the opposite direction, $R_{S(i+N/2)}$), more than N/2 +1 steps are required to obtain all of the desired resistances. For example, if the first coil lead connection resistance that is measured is $R_{S(i+N/2)-2}$ or $R_{S(i+N/2)+1}$, then eight rather than seven measurement steps will be required.

The two positions in which the fewest number of measurement steps are required to measure all desired resistances are therefore when the resistance measurement circuitry shown on the left hand side of FIG. 2 is positioned to measure coil lead connection resistance $R_{Si}$ and the resistance measurement circuitry shown on the right hand side of FIG. 2 is connected to measure either $R_{S(i+N/2)}$ or $R_{S(i+N/2)-1}$. Of these two arrangements, it will generally be preferred to use the former, because in that case an additional coil resistance ($R_{B(i+N/2)}$) will be interposed between the two input terminals to control circuit 46 when the voltage difference between commutator bars 38 and 44 is being maintained at a minimum. The additional coil resistance increases the voltage signal that results for a given current flowing through the coils between bars 38 and 44, therefore increasing the sensitivity with which this voltage measurement may be made.

Figure 6:
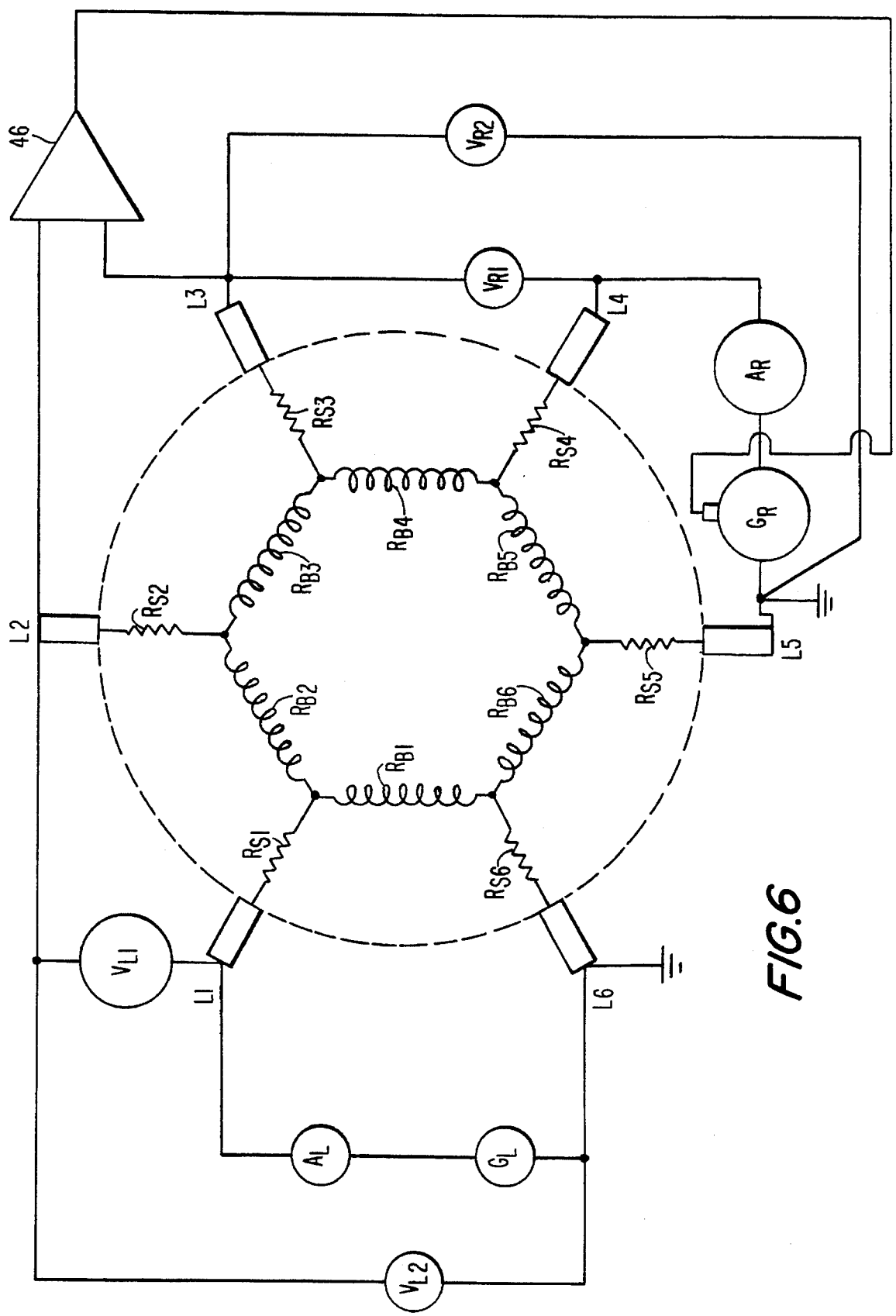
FIG. 6 is a circuit diagram of a testing arrangement constructed in accordance with the present invention that shows the various connections that are made when an armature having six coils is tested.

The arrangement where the resistance measurement circuitry shown on the left hand side of FIG. 2 is positioned to measure coil lead connection resistance $R_{Si}$ and the resistance measurement circuitry shown in the right hand side of FIG. 2 is connected to measure $R_{S(i+N/2)}$ is essential when an armature having six coils is used. As shown in FIG. 6, it is possible to measure the various resistances of a six coil armature by connecting generator $G_L$ and ammeter $A_L$ (or the fixed current source) between commutator bars L6 and L1, voltmeter $V_{L1}$ between bars L2 and L1, voltmeter $V_{L2}$ between bars L2 and L6, generator $G_R$ and ammeter $A_R$ (or the variable current source) between commutator bars L5 and L4, voltmeter $V_{R1}$ between bars L3 and L4, voltmeter $V_{R2}$ between bars L3 and L5. The feedback connection can be made by connecting the inputs of the control circuit 46 between bars L2 and L3. While this arrangement is possible, the arrangement in which the resistance measurement circuitry shown on the left hand side in FIG. 6 is positioned to measure coil lead connection resistance $R_{Si}$ ($R_{S1}$) and resistance measurement circuitry shown on the right hand side of FIG. 6 is connected to measure $R_{S(i+N/2)-1}$ ($R_{S3}$) is not possible, because both inputs to control circuit 46 would be connected to the same bar (bar L2). It would therefore not be possible to prevent the flow of current in any of the coils, as is required.

As noted above, it is necessary to perform N/2+1 measurement steps to obtain all 2N of the desired resistance values for the coil lead connections and coils. This is because, although a lead connection resistance and coil resistance with the same index value (e.g. $R_{S1}$ and $R_{B1}$) can be obtained in a single step using the measurement circuitry shown on the left hand side of FIG. 2 (voltmeters $V_{L1}$ and $V_{L2}$, ammeter $A_L$ and generator $G_L$ —or the fixed current source), it is not possible to obtain commonly indexed lead connection and coil resistances using the measurement circuitry shown on the right hand side of FIG. 2 (voltmeters $V_{R1}$ and $V_{R2}$, ammeter $A_R$ and generator $G_R$—or the variable current source). With the measurement circuitry shown on the right hand side of FIG. 2 either both $R_{S(i+N/2)}$ and $R_{B(i+N/2)+1}$ can be measured during a single step or $R_{S(i+N/2)-1}$ and $R_{B(i+N/2)}$ can be measured, but it is not possible to simultaneously measure, for example, $R_{S(i+N/2)}$ and $R_{B(i+N/2)}$. It is therefore necessary to perform an additional measurement step beyond the first N/2 steps to obtain the final required resistance.

Figure 7:
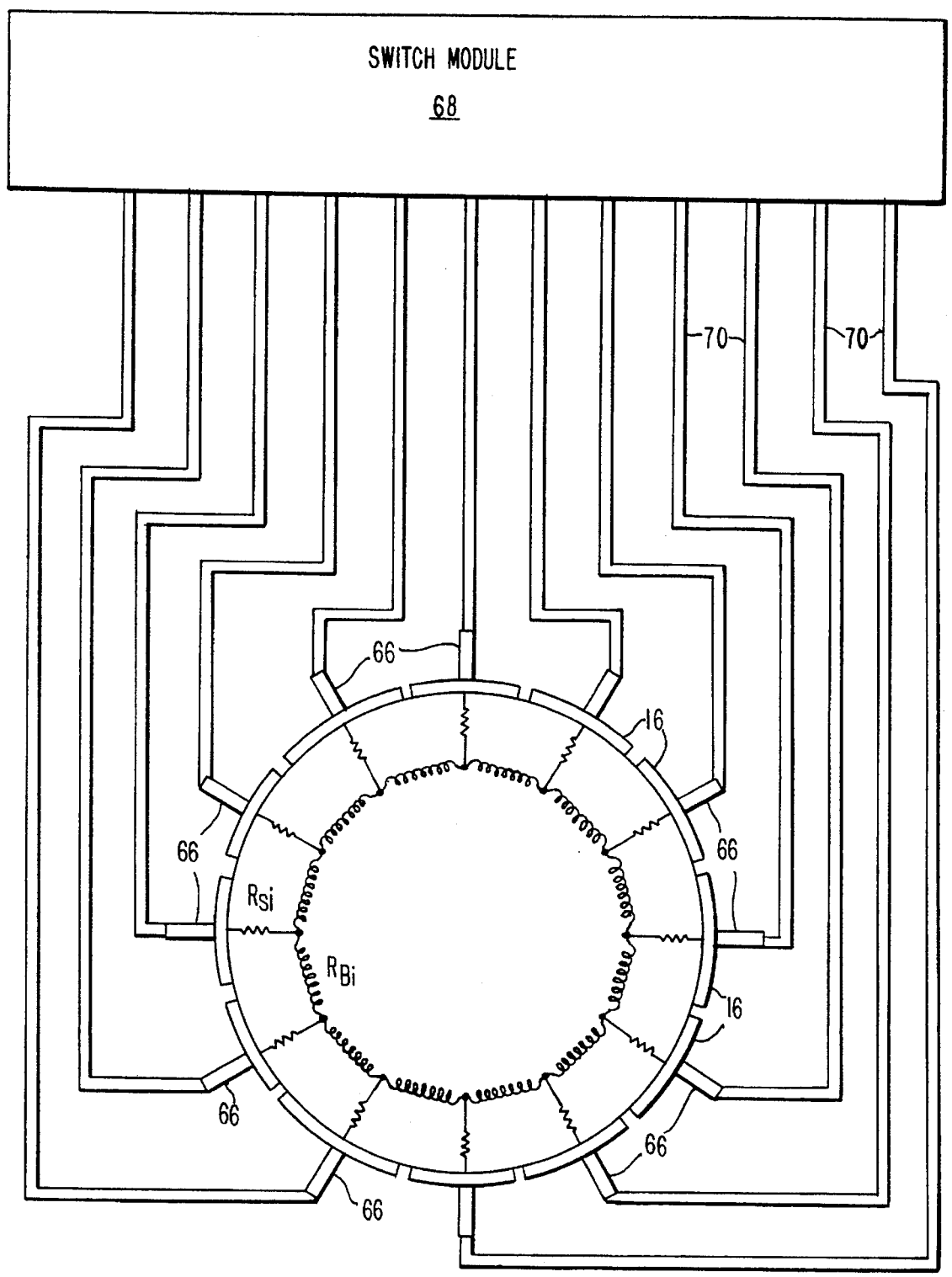
FIG. 7 is a schematic and circuit diagram showing the use of dedicated contact members to electrically contact each of the commutator bars of an armature without rotation of the armature.

The arrangement of FIG. 2 is preferably implemented using a stationary measurement apparatus that electrically switches between dedicated commutator contact members for each measurement step, although an alternative approach would be to rotate the armature relative to stationary contact member. As shown in FIG. 7, with the stationary armature arrangement contact members 66 make intimate electrical contact with each of the N commutator bars 16 of commutator 12. Switch module 68 contains appropriate electronic circuitry to provide an interface between control and processing circuitry (not shown in FIG. 6) and the armature. Preferably, there are two contact members 66 for each commutator bar 16. At commutator bars 16 where it is desired to apply and measure signals simultaneously, a first of the contact members 66 is used to apply signals and a second is used to measure signals. Signal lines 70 connect switch module 68 to contact members 66.

Switch module 68 preferably contains one or more switches for each contact member 66. Switch module 68 preferably also contains a shift register that can be programmed to direct the switches to apply the voltage signals from generators $G_L$ and $G_R$ or the current signals from the fixed and variable current supplies to the appropriate commutator bars 16.

Figure 8:
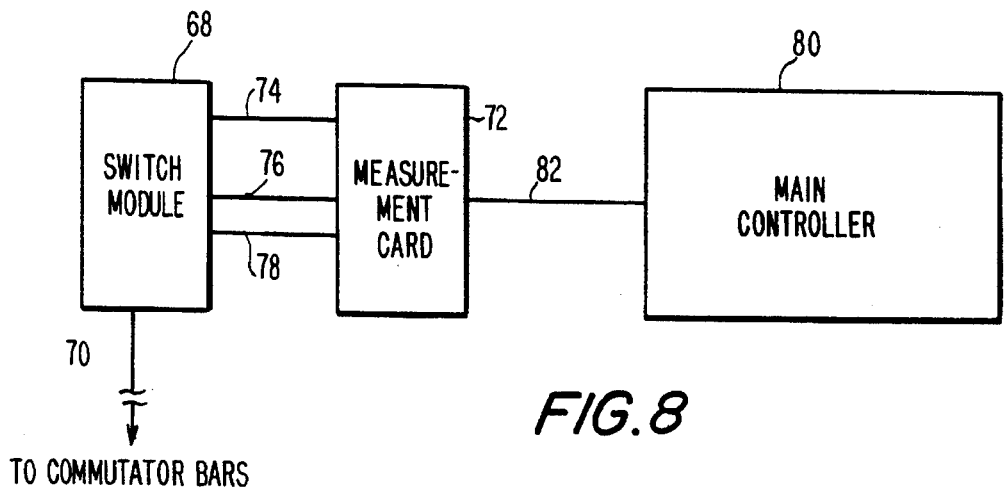
FIG. 8 is a schematic diagram of the testing apparatus showing the various connections between the commutator bars, the switch module, the measurement card, and the main controller.

As shown in FIG. 8, switch module 68 is connected to measurement card 72, which may be used to generate the digital control signals necessary to program the shift register in switch module 68. Digital control signals are passed from measurement card 72 to switch module 68 via bus 74. The voltage signals from generators $G_L$ and $G_R$ or the current signals from the fixed and variable current supplies are provided to switch module 68 via analog bus 76. When measuring a coil or coil lead connection resistance, the switches within switch module 68 are directed to pass the measured signals from commutator bars 16 to measurement card 72 via analog bus 78. Measurement card 72 is preferably a conventional industry-standard measurement card, capable of being driven by a main controller 80.

Main controller 80, which is preferably microprocessor based, executes control routines that direct measurement card 72 to implement the functions of generators $G_L$ and $G_R$ and ammeters $A_L$ and $A_R$ (or the fixed and variable current sources), and voltmeters $V_{L1}$, $V_{L2}$, $V_{R1}$, and $V_{R2}$. Main controller 80 and measurement card 72 communicate via bidirectional bus 82. Bus 82 provides a pathway for main controller 80 to pass control signals to measurement card 72, which direct the operation of the various signal measurement and generation functions of the measurement card 72. In addition, the measurement card 72 can condition the analog signals (e.g. by analog to-digital conversion) and pass the conditioned measurement signals to main controller 80.

Although a plurality of switches, a measurement card, and a microprocessor were used to selectively direct, digitize, and process the signals from the lead connections and coils, various other hardware and software embodiments are possible. For example, a measurement card could be provided with greater processing abilities so that all necessary digital and analog processing of the various measurements could be performed prior to transmitting the results to the main controller.

Figure 9:
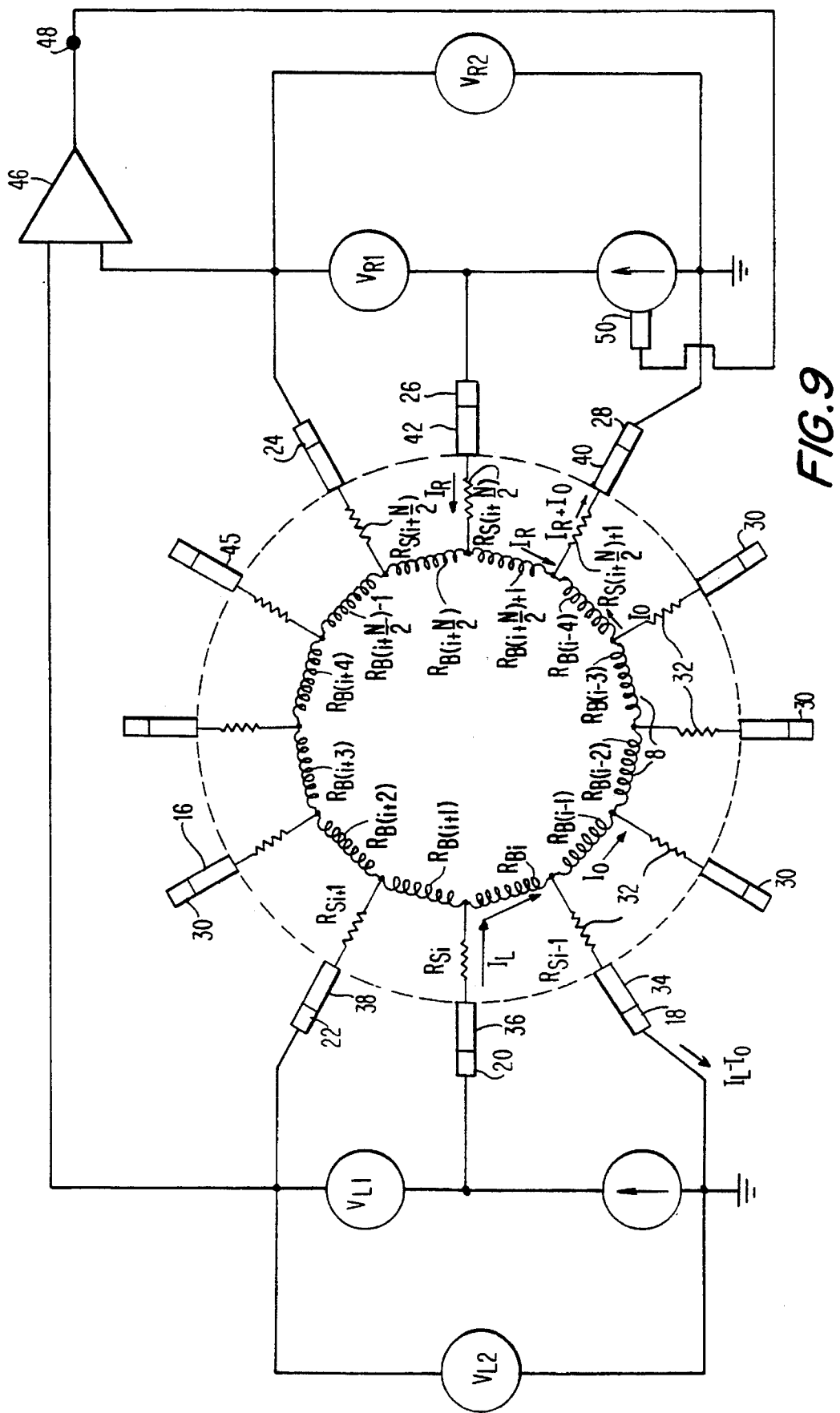
FIG. 9 is a schematic diagram similar to that of FIG. 2, in which the serially connected voltage generators and ammeters have been replaced by current sources.

As described above, the fixed current inducing circuitry can be provided by a serially connected fixed potential voltage generator and ammeter. Similarly, the variable current inducing circuitry can be provided by a serially connected variable potential voltage generator and ammeter. An illustrative embodiment of the present invention in which both the fixed and variable current inducing circuitry has been provided by current sources is shown in FIG. 9. It is also possible to provide mixed arrangements in which a current source is used for the fixed current inducing circuitry and a serially connected generator and ammeter is used for the variable current inducing circuitry and vice versa.

It will be understood that the foregoing is merely illustrative of the principles of this invention, and that various modifications can be made by those skilled in the art without departing from the scope and spirit of the invention.

The invention claimed is:

1. Apparatus for testing armatures on which a plurality of serially connected wire coils are wound to form a continuous wire loop, each coil having a pair of endpoints and being electrically connected to two adjoining coils and two coil lead connections at said endpoints, the armature having a first coil connected between first and second coil lead connections, a second coil connected between third and fourth coil lead connections, third and fourth coils connected respectively to said first and second coils, and a group of one or more coils connected between said third and fourth coils, the apparatus comprising:

fixed current inducing circuitry for inducing a first current in said first coil lead connection and in said first coil;

variable current inducing circuitry for inducing a second current in said third coil lead connection and in said second coil;

a control circuit having first and second input terminals connected respectively to fifth and sixth coil lead connections connected to the coils in said group of one or more coils connected between said third and fourth coils, said control circuit measuring a first voltage at said fifth coil lead connection and a second voltage at said sixth coil lead connection, said control circuit directing the variable current inducing circuitry to adjust the second current so that said second voltage is substantially equal to said first voltage, thereby preventing the flow of current in said third and fourth coils and in each of the coil lead connections connected to the coils in said group of coils connected between said third and fourth coils;

first voltage measuring circuitry connected across at least said first coil lead connection and said third coil for measuring a first coil lead connection voltage, a first coil lead connection resistance being determined based on said first coil lead connection voltage and said first current; and second voltage measuring circuitry connected across at least said third coil lead connection and said fourth coil for measuring a third coil lead connection voltage, a third coil lead connection resistance being determined based on said third coil lead connection voltage and said second current;

third voltage measuring circuitry connected across at least said first coil for measuring a first coil voltage, a first coil resistance being determined based on said first coil voltage and said first current; and fourth voltage measuring circuitry connected across at least said second coil for measuring a second coil voltage, a second coil resistance being determined based on said second coil voltage and said second current, wherein said first coil lead connection resistance, said third coil lead connection resistance, said first coil resistance, and said second coil resistance are measured within a single measurement step.

2. The apparatus defined in claim 1, wherein said fixed current inducing circuitry comprises a serially connected voltage generator and an ammeter.

3. The apparatus defined in claim 1, wherein said variable current inducing circuitry comprises a serially connected voltage generator and an ammeter.

4. The apparatus defined in claim 1, wherein said fixed current inducing circuitry comprises a fixed current supply for providing said first current.

5. The apparatus defined in claim 1, wherein said variable current inducing circuitry comprises a variable current supply for providing said second current.

6. The apparatus defined in claim 1, wherein said fixed current inducing circuitry and said variable current inducing circuitry induce said first and second currents in diametrically opposed coil lead connections, such that said first coil lead connection is diametrically opposed to said third coil lead connection.

7. The apparatus defined in claim 1, wherein said fixed current inducing circuitry and said variable current inducing circuitry induce said first and second currents in nearly diametrically opposed coil lead connections, such that said first coil lead connection is diametrically opposed to said fourth coil lead connection.

8. The apparatus defined in claim 1, wherein said fifth coil lead connection is connected to said third coil and said sixth coil lead connection is connected to said fourth coil.

9. The apparatus defined in claim 1, wherein:

said fifth coil lead connection is connected to said third coil; and said first voltage measuring circuitry is connected between said first coil lead connection and said fifth coil lead connection.

10. The apparatus defined in claim 1, wherein:

said sixth coil lead connection is connected to said fourth coil; and said second voltage measuring circuitry is connected between said third coil lead connection and said sixth coil lead connection.

11. The apparatus defined in claim 1, wherein:

said fifth coil lead connection is connected to said third coil; and said third voltage measuring circuitry is connected between said second coil lead connection and said fifth coil lead connection.

12. The apparatus defined in claim 1, wherein:

said sixth coil lead connection is connected to said fourth coil; and said fourth voltage measuring circuitry is connected between said fourth coil lead connection and said sixth coil lead connection.

13. Apparatus for testing armatures on which a plurality of serially connected wire coils are wound to form a continuous wire loop, each coil being electrically connected to two adjoining coils and two coil lead connections at a pair of coil endpoints, the armature having a first of said coil lead connections, a first of said coils connected to said first coil lead connection at a first of said coil endpoints, a second of said coils lead connections connected to said first coil at a second of said coil endpoints, a third of said coil lead connections, a second of said coils connected to said third coil lead connection at a third of said coil endpoints, a fourth of said coil lead connections connected to said second coil at a fourth of said coil endpoints, a third coil connected to said first coil at said first coil endpoint, said third coil having a fifth coil endpoint, a fourth coil connected to said second coil at said third coil endpoint, said fourth coil having a sixth coil endpoint, a group of said coils that joins said third and fourth coils connected between said fifth and sixth endpoints, a group of said coil lead connections each of which is connected to one of said endpoints of said group of coils, and fifth and sixth coil lead connections respectively connected to said fifth and sixth coil endpoints, the apparatus comprising:

fixed current inducing circuitry for inducing a first current in said first coil lead connection, in said first coil, and in said second coil lead connection;

variable current inducing circuitry for inducing a second current in said third coil lead connection, in said second coil, and in said fourth coil lead connection;

a control circuit having first and second input terminals, said first input terminal being connected to one of said coil lead connections in said group of coil lead connections and said second input terminal being connected to a different one of said coil lead connections in said group of coil lead connections, said control circuit measuring a first voltage at said first input terminal and a second voltage at said second input terminal, said control circuit directing the variable current inducing circuitry to adjust the second current so that said second voltage is substantially equal to said first voltage, thereby preventing the flow of current in said group of coils, in said third and fourth coils, and in said group of coil lead connections;

first voltage measuring circuitry connected between said first coil lead connection and one of said coil lead connections in said group of coil lead connections for measuring a first coil lead connection voltage; and second voltage measuring circuitry connected between said third coil lead connection and one of said coil lead connections in said group of coil lead connections for measuring a third coil lead connection voltage, wherein a first coil lead connection resistance is determined based on said first coil lead connection voltage and said first current, and a third coil lead connection resistance is determined based on said third coil lead connection voltage and said second current.

14. The apparatus defined in claim 13 further comprising third voltage measuring circuitry connected between said second coil lead connection and one of said coil lead connections in said group of coil lead connections for measuring a first coil voltage, wherein a first coil resistance is determined based on said first coil voltage and said first current.

15. The apparatus defined in claim 14, wherein said third voltage measuring circuitry is connected between said second coil lead connection and said fifth coil lead connection.

16. The apparatus defined in claim 13 further comprising fourth voltage measuring circuitry connected between said fourth coil lead connection and one of said coil lead connections in said group of coil lead connections for measuring a second coil voltage, wherein a second coil resistance is determined based on said second coil voltage and said second current.

17. The apparatus defined in claim 16, wherein said fourth voltage measuring circuitry is connected between said fourth coil lead connection and said sixth coil lead connection.

18. The apparatus defined in claim 13, wherein said fixed current inducing circuitry comprises a serially connected voltage generator and an ammeter.

19. The apparatus defined in claim 13, wherein said variable current inducing circuitry comprises a serially connected voltage generator and an ammeter.

20. The apparatus defined in claim 13, wherein said fixed current inducing circuitry comprises a fixed current supply for providing said first current.

21. The apparatus defined in claim 13, wherein said variable current inducing circuitry comprises a variable current supply for providing said second current.

22. The apparatus defined in claim 13, wherein said fixed current inducing circuitry and said variable current inducing circuitry induce said first and second currents in diametrically opposed coil lead connections, such that said first coil lead connection is diametrically opposed to said third coil lead connection.

23. The apparatus defined in claim 13, wherein said fixed current inducing circuitry and said variable current inducing circuitry induce said first and second currents in nearly diametrically opposed coil lead connections, such that said first coil lead connection is diametrically opposed to said fourth coil lead connection.

24. The apparatus defined in claim 13, wherein said first input terminal is connected to said fifth coil lead connection and said second input terminal is connected to said sixth coil lead connection.

25. The apparatus defined in claim 13, wherein said first voltage measuring circuitry is connected between said first coil lead connection and said fifth coil lead connection.

26. The apparatus defined in claim 13, wherein said second voltage measuring circuitry is connected between said third coil lead connection and said sixth coil lead connection.

27. A method of testing armatures on which a plurality of serially connected wire coils are wound to form a continuous wire loop, each coil having a pair of endpoints and being electrically connected to two adjoining coils and two coil lead connections at said endpoints, the armature having a first coil connected between first and second coil lead connections, a second coil connected between third and fourth lead connections, third and fourth coils connected respectively to said first and second coils, a group of one or more coils connected between said third and fourth coils, and a group of said coil lead connections each of which is connected to one of said endpoints of said group of coils, said group of coil lead connections including fifth and sixth coil lead connections, the method comprising the steps of:

inducing a fixed first current in said first coil lead connection and said first coil;

inducing a variable second current in said third coil lead connection and said second coil;

measuring the voltage between said fifth and sixth coil lead connections;

varying said second current in response to the measured voltage between said fifth and sixth coil lead connections, so that the voltages at said fifth and sixth coil lead connections become substantially equal, thereby preventing current from flowing in at least said third and fourth coils; and measuring in a single step (a) a first coil lead connection voltage across said first coil lead connection, (b) a third coil lead connection voltage across said third coil lead connection (c) a first coil voltage across said first coil, and (d) a second coil voltage across said second coil.

28. The method defined in claim 27, further comprising the steps of:

obtaining an independent resistance for said first coil lead connection based on said first coil lead connection voltage and said first current;

obtaining an independent resistance for said third coil lead connection based on said third coil lead connection voltage and said second current;

obtaining an independent resistance for said first coil based on said first coil voltage and said first current; and obtaining an independent resistance for said second coil based on said second coil voltage and said second current.

29. The method defined in claim 27, wherein the step of inducing said first current comprises the step of using a serially connected fixed potential voltage generator and an ammeter to generate said first current.

30. The method defined in claim 27, wherein the step of inducing said second current comprises the step of using a serially connected variable potential voltage generator and an ammeter to generate said second current.

31. The method defined in claim 27, wherein the step of inducing said first current comprises the step of using a fixed current source to apply said first current.

32. The method defined in claim 27, wherein the step of inducing said second current comprises the step of using a variable current source to apply said second current.

33. The method defined in claim 27, wherein the step of measuring the voltage between said fifth and sixth coil lead connections comprises the step of measuring the voltage between said fifth coil lead connection connected to said third coil and said sixth coil lead connection connected to said fourth coil.

34. The method defined in claim 27, wherein Said fifth coil lead connection is connected to said third coil and said sixth coil lead connection is connected to said fourth coil, the step of measuring said first and third coil lead connection voltages comprising the step of measuring the voltage between said first coil lead connection and said fifth coil lead connection and measuring the voltage between said third coil lead connection and said sixth coil lead connection.

35. The method defined in claim 27, wherein the step of measuring said first coil voltage comprises the step of measuring the voltage between said fifth coil lead connection and said second coil lead connection.

36. The method defined in claim 27, wherein the step of measuring said second coil voltage comprises the step of measuring the voltage between said sixth coil lead connection and said fourth coil lead connection.

37. A method of testing armatures on which a plurality of serially connected wire coils are wound to form a continuous wire loop, each coil being electrically connected to two adjoining coils and two coil lead connections at a pair of coil endpoints, said armature having a first coil to which a first coil lead connection is connected at a first coil endpoint, a second coil lead connection connected to said first coil at a second coil endpoint, a second coil to which a third coil lead connection is connected at a third coil endpoint, a fourth coil lead connection connected to said second coil at a fourth lead connection endpoint, a third coil connected to said first coil at said first coil endpoint, a fifth coil lead connection connected to said third coil at a fifth coil endpoint, a fourth coil connected to said second coil at said third coil endpoint, a sixth coil lead connection connected to said fourth coil at a sixth coil endpoint, a group of coils connected between said fifth and sixth coil endpoints, said group of coils joining said third and fourth coils, and a group of coil lead connections each connected to one of the endpoints of the coils in said group of coils, the method comprising the steps of:

inducing a fixed first current in said first coil lead connection and in said first coil;

inducing a variable second current in said third coil lead connection and in said second coil;

measuring the voltage between any two predetermined coil lead connections in said group of coil lead connections;

varying said second current in response to the measured voltage between said two predetermined coil lead connections so that the voltages at said two predetermined coil lead connections become substantially equal, thereby preventing current from flowing in said group of coils, said third and fourth coils, and in said group of coil lead connections;

measuring in a single step (a) a first coil lead connection voltage across said first coil lead connection, and (b) a third coil lead connection voltage across said third coil lead connection; and determining independent resistances for said first coil lead connection and said third coil lead connection based on said first coil lead connection voltage and said first current and based on said third coil lead connection voltage and said second current.

38. The method defined in claim 37, wherein the step of measuring in a single step further comprises (c) measuring a first coil voltage across said first coil.

39. The method defined in claim 38, further comprising the step of determining a first coil resistance based on said first coil voltage and said first current.

40. The method defined in claim 38, wherein the step of measuring said first coil voltage comprises the step of measuring the voltage between said fifth and second coil lead connections.

41. The method defined in claim 37, wherein the step of measuring in a single step further comprises (d) measuring a second coil voltage across said second coil.

42. The method defined in claim 41, further comprising the step of determining a second coil resistance based on said second coil voltage and said second current.

43. The method defined in claim 40, wherein the step of measuring said second coil voltage comprises the step of measuring the voltage between said sixth and fourth coil lead connections.

44. The method defined in claim 37, wherein the step of inducing said first current comprises the step of using a serially connected fixed potential voltage generator and an ammeter to generate said first current.

45. The method defined in claim 37, wherein the step of inducing said second current comprises the step of using a serially connected variable potential voltage generator and an ammeter to generate said second current.

46. The method defined in claim 37, wherein the step of inducing said first current comprises the step of using a fixed current source to apply said first current.

47. The method defined in claim 37, wherein the step of inducing said second current comprises the step of using a variable current source to apply said second current.

48. The method defined in claim 37, wherein the step of measuring the voltage between said two predetermined coil lead connections comprises the step of measuring the voltage between said fifth coil lead connection and said sixth coil lead connection.

49. The method defined in claim 37, wherein the step of measuring said first and third coil lead connection voltages comprises the step of measuring the voltage between said first and fifth coil lead connections and measuring the voltage between said third and sixth coil lead connections.

* * * * *